United States Patent [19]
Hanna et al.

[11] Patent Number: 5,182,476
[45] Date of Patent: Jan. 26, 1993

[54] OFFSET CANCELLATION CIRCUIT AND METHOD OF REDUCING PULSE PAIRING

[75] Inventors: John E. Hanna, Mesa; Behrooz Abdi, Chandler, both of Ariz.

[73] Assignee: Motorola, Inc., Schaumburg, Ill.

[21] Appl. No.: 737,282

[22] Filed: Jul. 29, 1991

[51] Int. Cl.$^5$ .................... G06G 7/10; H03B 1/00
[52] U.S. Cl. .................... 307/491; 307/494; 307/354; 307/264; 328/162; 330/9
[58] Field of Search ............ 307/491, 494, 264, 529, 307/354, 351, 260, 518; 328/162; 330/9

[56] References Cited

U.S. PATENT DOCUMENTS

| | | | |
|---|---|---|---|
| 4,377,759 | 3/1983 | Ohhata et al. | 307/491 |
| 4,430,622 | 2/1984 | Simoes | 307/491 |
| 4,575,683 | 3/1986 | Roberts et al. | 307/354 |
| 4,710,652 | 12/1987 | Petr | 307/491 |
| 5,047,727 | 9/1991 | Theus | 307/494 |

*Primary Examiner*—Timothy P. Callahan
*Attorney, Agent, or Firm*—Robert D. Atkins

[57] ABSTRACT

An offset cancellation circuit corrects DC offset appearing at the input of a comparator circuit. The first input of a summing junction receives an input signal containing DC offset. The output of the summing junction drives the input of the comparator and a feedback amplifier, the latter of which returns to the second input of the summing junction. Any DC offset is processed through the feedback amplifier where it subtracts from the input signal for providing zero DC offset at the input of the comparator.

15 Claims, 3 Drawing Sheets

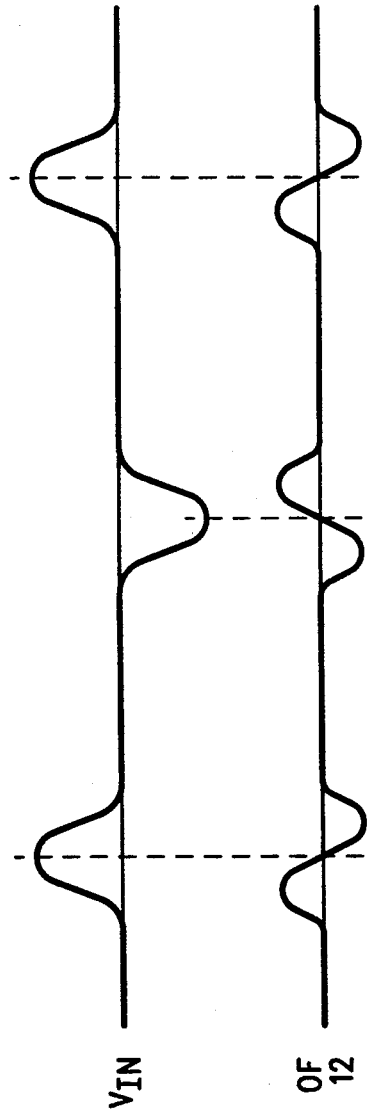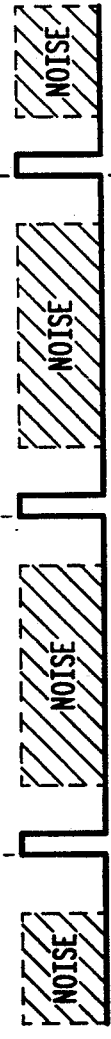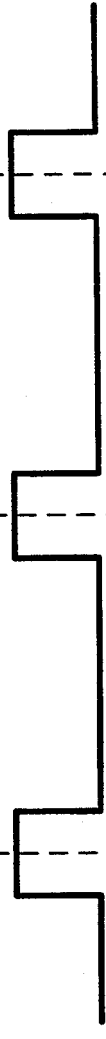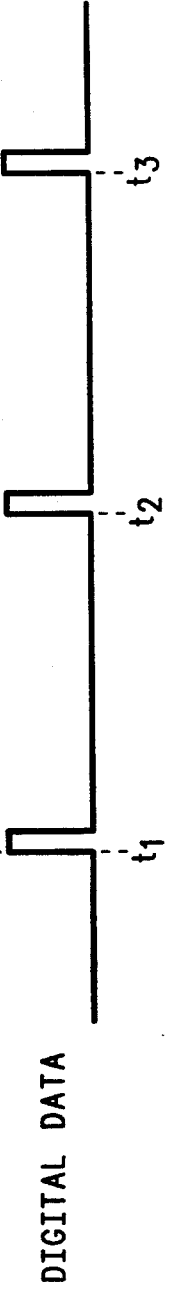

OFFSET CANCELLATION CIRCUIT AND METHOD OF REDUCING PULSE PAIRING

BACKGROUND OF THE INVENTION

This invention relates in general to offset cancellation circuits and, more particularly, to an offset cancellation circuit for reducing pulse pairing.

In computer disk drive applications, an analog signal received from the read/write head as it passes over the disk platter is converted to a digital signal for further processing by the microprocessor. To obtain maximum signal-to-noise ratio for the analog-to-digital conversion, a signal level qualification is performed on the analog signal to ensure its amplitude is sufficient to distinguish over any noise present and to convert it to a digital logic level. Furthermore, it is desirable to generate a clock pulse corresponding to the peak of the analog signal for timing qualification to ensure the corresponding digital signal is sampled at mid-pulse.

Accordingly, the analog signal from the read/write head of the disk drive is typically processed through a differentiator circuit to detect the peak of the analog signal which corresponds to a zero-crossing of the differentiated signal. A comparator circuit changes state at each zero-crossing of the differentiated signal, while a zero-crossing detector is responsive to the output signal of the comparator for generating the clock pulse used to sample the converted digital signal at mid-pulse.

A common problem with the prior art timing qualification circuit is the introduction of a DC offset at the output of the differentiator circuit which has the effect of shifting the zero-crossing point of the differentiated signal and providing inaccurate timing information. The DC offset tends to shift adjacent clock pulse pairs closer together, commonly known as pulse pairing, which causes the digital signal to be sampled off mid-pulse. The clock pulse pairing reduces the margin of identifying in which time window a pulse has occurred. It is desirable to minimize pulse pairing and maintain equal temporal spacing between the clock pulses.

A typical solution for the DC offset problem is to AC-couple the output of the differentiator circuit with capacitors inserted in series to the input of the comparator circuit. The AC-coupled capacitors require values in the range of 0.1 microfarads to effectively remove the DC offset. Such large valued capacitors must be placed external to the integrated circuit (IC) chip, and for differential operation, require four IC pins to connect two external capacitors.

Furthermore, the large value AC-coupled capacitors have an associated long time constant to charge to an operational level. It is common for the differentiator and comparator circuits to be placed in an inoperative sleep mode to conserve power when the disk drive is not being accessed. Yet, the timing qualification circuit must begin operating very rapidly once a disk read request is issued. The large value capacitors tend to limit the operating speed of the disk drive by nature of the charge time for the external capacitors when returning to operation from sleep mode.

Hence, what is needed is an improved offset cancellation circuit for removing DC offset while reducing pin allocation for external capacitors and reducing the circuit start-up time after periods of non-operation.

SUMMARY OF THE INVENTION

Briefly stated, the invention comprises an offset cancellation circuit comprising a summing junction having a first input coupled for receiving an input signal with a DC offset and an output for providing an offset corrected signal. A comparator circuit has an input coupled to the output of the summing junction for receiving the offset corrected signal and an output which changes state at each zero crossing of the offset corrected signal. A first amplifier circuit includes an input coupled to the input of the comparator and an output coupled to the second input of the summing junction for providing an offset correction signal to remove the DC offset from the input signal and provide the offset corrected signal at the input of the comparator.

In another aspect, the present invention is a method of canceling DC offset at an input of a comparator circuit comprising the steps of applying an input signal having a DC offset to a first input of a summing junction, sensing the DC offset in the input signal and amplifying the DC offset for providing an offset correction signal at a second input of the summing junction, and subtracting the offset correction signal from the input signal for removing the DC offset from the input signal and providing an offset corrected signal at the input of the comparator.

BRIEF DESCRIPTION OF THE DRAWINGS

FIGS. 2A-2F is a waveform plot useful in the explanation of the block diagram of FIG. 1.

DETAILED DESCRIPTION OF THE PREFERRED EMBODIMENT

Figure 1:
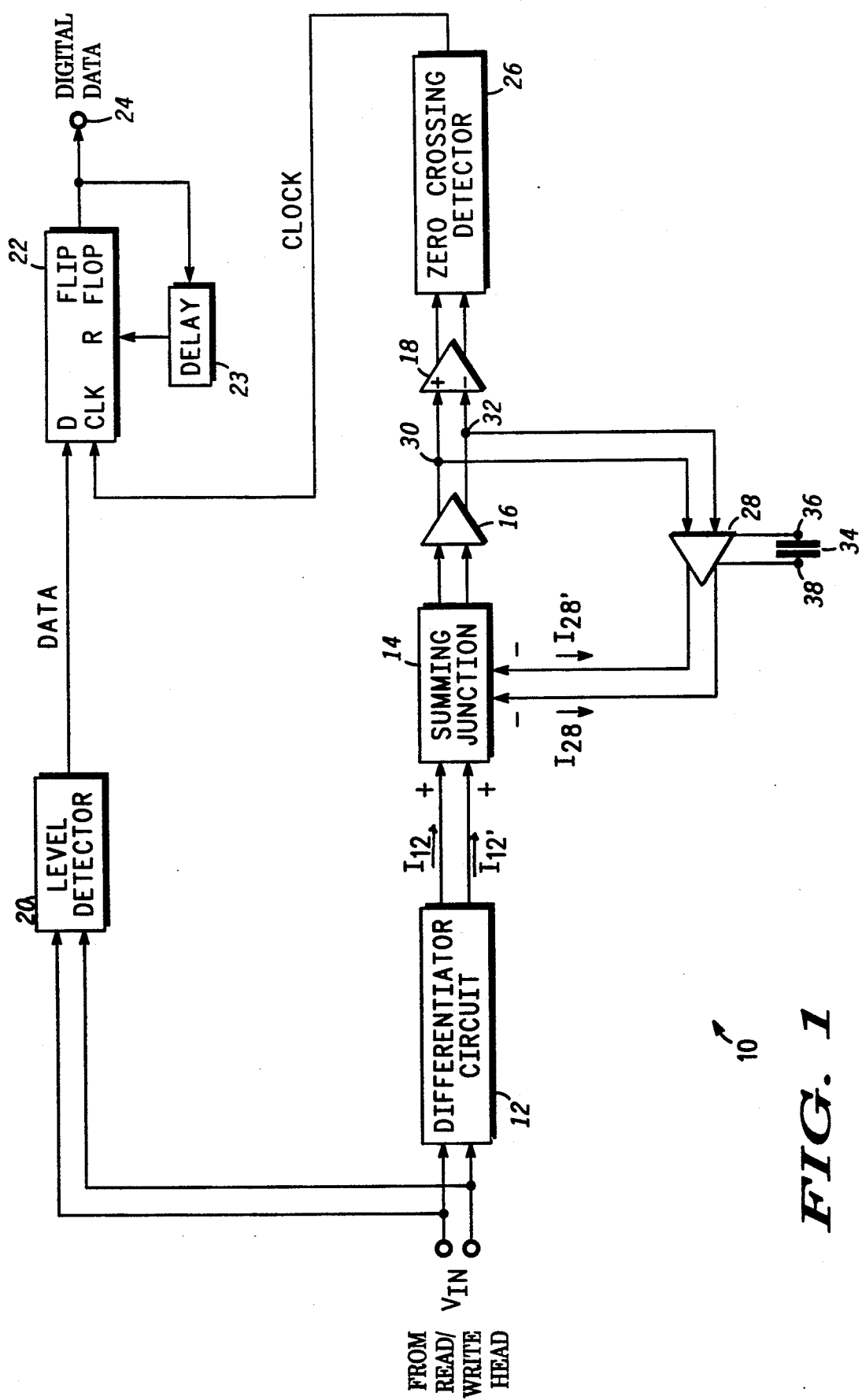
FIG. 1 is a simplified block diagram illustrating an embodiment of the present invention.

An offset cancellation circuit 10 is shown in FIG. 1 for reducing pulse pairing as the differential analog input signal, $V_{IN}$, from the read/write heads of a computer disk drive (not shown) is converted to a clock signal CLOCK corresponding to the peak of the analog input signal. The analog input signal $V_{IN}$ is differentiated through differentiator 12 for providing differential currents $I_{12}$ and $I_{12}'$ flowing into summing junction 14. The differential output signal of summing junction 14 is amplified by gain stage 16 and applied to the non-inverting and inverting inputs of comparator 18.

The analog input signal $V_{IN}$ is also processed through level detector circuit 20 for converting the analog signal to a digital signal DATA which is applied to the data input of flipflop 22. Level detector circuit 20 converts the analog input signal $V_{IN}$ to a corresponding digital level if the amplitude of the analog signal is above a predetermined threshold. The output signal of comparator 18 is processed through zero-crossing detector 26 for providing a CLOCK signal at clock input of flipflop 22. The DIGITAL DATA signal from flipflop 22 is fed back through delay circuit 23 to the reset input of the same creating a pulse having a width as determined by the delay through delay circuit 23. Thus, the CLOCK signal from zero-crossing detector 26 produces a DIGITAL DATA pulse at output 24 at each transition of the output signal of comparator 18.

The waveform plots shown in FIGS. 2A-2F are useful in explaining the operation of circuit combination 12-26. The analog input signal $V_{IN}$ in FIG. 2A is differentiated to locate the peak value corresponding to the zero-crossing of the differentiated signal as shown in FIG. 2B at times $t_1$, $t_2$ and $t_3$. Gain stage 16 provides amplification of the differentiated signals $I_{12}$ and $I_{12}'$. Comparator 18 changes state at each zero-crossing of the differentiated signal, as shown in FIG. 2C, thereby producing the CLOCK pulse at the output of zero-crossing detector 26, as shown at times $t_1$, $t_2$ and $t_3$ in FIG. 2D, to clock the digital signal DATA from the output of level detector circuit 20 into flipflop 22 at the mid-pulse, see FIG. 2E. The DIGITAL DATA pulses are produced at output 24 at times $t_1$, $t_2$ and $t_3$ in FIG. 2F. The CLOCK signal and the output signal of comparator 18 are shown to contain noise between the zero crossings of differentiator 12.

Thus, level detector circuit 20 provides level qualification of the analog input signal to ensure its amplitude is sufficient to distinguish over any noise present and to convert it to digital logic levels. Differentiator 12, summing junction 14, gain stage 16, comparator 18 and zero-crossing detector 26 provide timing qualification to generate a clock pulse corresponding to the peak of the analog signal to ensure the corresponding digital signal is sampled at mid-pulse. The combination of signal level qualification and timing qualification improves the signal-to-noise ratio of the DIGITAL DATA signal latched at the output of flipflop 22.

Any DC offset appearing at the inputs of comparator 18 induces timing error between the CLOCK signal and the DATA signal and produces the pulse pairing described in the prior art. To provide the offset cancellation at the input of comparator 18, feedback amplifier 28 includes first and second inputs coupled to the non-inverting and inverting inputs of comparator 18 at nodes 30 and 32, respectively. The differential output currents $I_{28}$ and $I_{28}'$ of feedback amplifier 28 represent the offset error at nodes 30 and 32 and are subtracted from the differentiated currents $I_{12}$ and $I_{12}'$ in summing junction 14 for canceling the offset error. Feedback amplifier 28 operates as a low pass filter by nature of external capacitor 34 coupled between terminals 36 and 38. The dominate pole of feedback amplifier 28 may be set at 20 hertz with a capacitor value of 0.01 microfarads and the frequency of input signal $V_{IN}$ operating at several megahertz.

The following equations provide a mathematical explanation of offset cancellation circuit 10, wherein the gain between the output of differentiator 12 and nodes 30-32 is given as:

$$\frac{V_o}{V_i} = \frac{G_{16}(s + p)}{s + p + G_{16}G_{28}p} \quad (1)$$

where:
$V_o$ is the output signal of gain stage 16
$V_i$ is the input signal of summing junction 14
s is the complex Laplace transform variable
p is the dominate pole of capacitor 34
At zero frequency and assuming $G_{28}G_{16} \gg 1$, equation (1) reduces to:

$$\frac{V_o}{V_i} = \frac{G_{16}}{1 + G_{16}G_{28}} \approx \frac{1}{G_{28}} \quad (2)$$

For low frequencies, feedback amplifier 28 is dominant and cancels the DC offset. Alternately at high frequency, feedback amplifier 28 is effectively removed from offset cancellation circuit 10 as demonstrated by:

$$\frac{V_o}{V_i} = G_{16} \quad (3)$$

Figure 3:
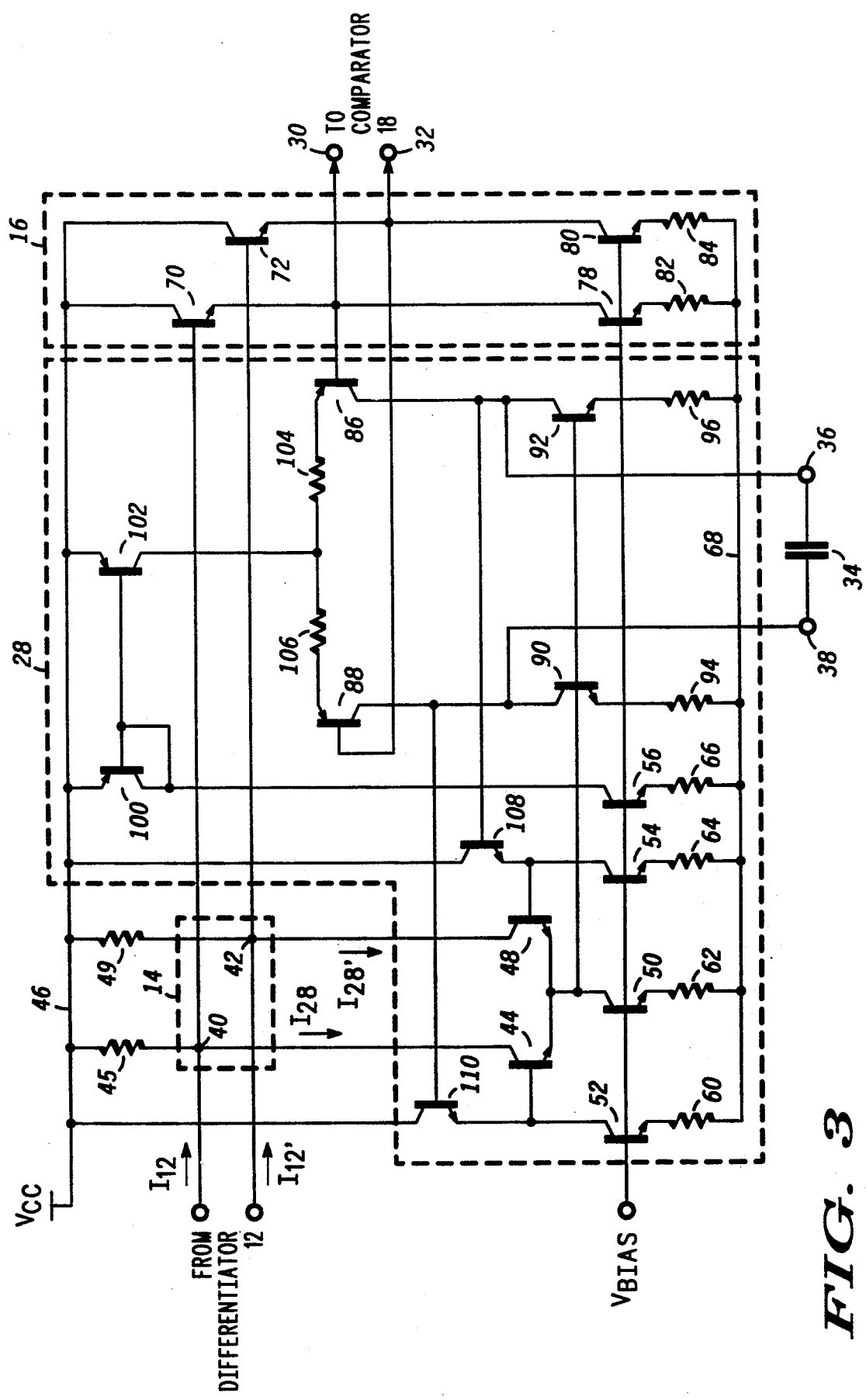
FIG. 3 is a schematic diagram illustrating further detail of the feedback amplifier of FIG. 1.

Further detail of summing junction 14, gain stage 16 and feedback amplifier 28 is illustrated in FIG. 3, wherein summing junction 14 includes nodes 40 and 42 for subtracting the offset error currents $I_{28}$ and $I_{28}'$ from the differentiated currents $I_{12}$ and $I_{12}'$. Feedback amplifier 28 includes transistor 44 having a collector coupled to node 40, and through resistor 45 to power supply conductor 46 operating at a positive potential such as $V_{CC}$, for conducting offset correction current $I_{28}$. Transistor 48 has a collector coupled to node 42 and through resistor 49 to power supply conductor 46 for conducting offset correction current $I_{28}'$. Resistors 45 and 49 conduct balanced collector currents through transistors 44 and 48 upon which the offset correction currents $I_{28}$ and $I_{28}'$ are superimposed. The common emitters of transistors 44 and 48 are coupled to the collector of transistor 50. Transistors 50, 52, 54 and 56 have emitters coupled through resistors 60, 62, 64 and 66, respectively, to power supply conductor 68 operating at ground potential. The bases of transistors 50–56 receive bias potential $V_{BIAS}$ allowing each to operate as a current source.

The differential output currents of differentiator 12, $I_{12}$ and $I_{12}'$, less offset correction currents $I_{28}$ and $I_{28}'$, develop voltages at nodes 40 and 42 to drive the bases of transistors 70 and 72, respectively, as part of gain stage 16. The collectors of transistors 70 and 72 are coupled to power supply conductor 46, while the emitters of the same are coupled to the collectors of transistors 78 and 80 at nodes 30 and 32 leading to the non-inverting and inverting inputs of comparator 18. Transistors 70 and 72 operate as emitter-follower buffers. The common bases of transistors 78–80 are coupled for receiving bias potential $V_{BIAS}$, and the emitters are coupled through resistors 82 and 84 to power supply conductor 68, respectively.

Feedback amplifier 28 is responsive to the potentials developed at nodes 30 and 32 for driving the bases of PNP transistors 86 and 88. The collectors of transistors 86 and 88 are coupled through the collector-emitter conduction paths of transistors 90 and 92 and through resistors 94 and 96 to power supply conductor 68, respectively. The bases of transistors 90 and 92 receive a bias potential developed at the common emitters of transistors 44 and 48. External capacitor 34 is coupled between the collectors of transistors 86 and 88 at terminals 36 and 38.

A current mirror formed of transistors 100 and 102 includes an input coupled to the collector of transistor 56 and an output coupled through resistors 104 and 106 to the emitters of transistors 86 and 88, respectively. Current mirror circuit 100-102 sources current into transistors 86–88 equal to the current flowing through transistors 44 and 48. The collectors of transistors 86 and 88 are also coupled to the bases of transistors 108 and 110 which operate as emitter-follower buffers with emitters coupled to the bases of transistors 48 and 44, respectively. The collectors of transistors 108 and 110 are coupled to power supply conductor 46.

Any DC offset appearing at terminals 30 and 32 drives amplifier 28 to vary the currents $I_{28}$ and $I_{28}'$ as necessary to subtract from currents $I_{12}$ and $I_{12}'$ and compensate for the DC offset. For example, if the DC offset had terminal 30 at a higher single-ended potential than that at terminal 32, transistor 88 would conduct more current thereby raising the potential at the base of transistor 110 and correspondingly at the base of transistor 44. Current $I_{28}$ increases drawing more of current $I_{12}$ from node 40 down through transistor 44 and reducing the potential at the base of transistor 70. The emitter-follower configuration of transistor 70 then reduces the potential at node 30 to correct the DC offset. Alternately, if a DC offset caused the potential at terminal 30 to fall relative to terminal 32, then transistor 86 conducts more current which increases the base voltage of transistor 108 and transistor 48. Current $I_{28}'$ increases accordingly reducing the potential at node 42 and bringing the potential at terminal 32 back down by the DC offset. By removing the DC offset from the input of comparator 18, the clock pulse pairing problem noted in the prior art is significantly reduced.

At higher frequencies, capacitor 34 lowers the impedance between the collectors of transistors 86-88 effectively becoming a short circuit, removing the gain and disabling the AC feedback signal through transistors 110 and 108. Thus, the high frequency components of the differentiated signal ($I_{12}-I_{28}$, $I_{12}'-I_{28}'$) cannot pass through feedback amplifier 28. Only the low frequency components of the differentiated signal feed back to summing junction 14 to correct the DC offset.

External capacitor 34 requires only two IC pins as compared to four IC pins for the AC-coupled capacitors described in the prior art. Furthermore, because of the matched impedances on both side of capacitor 34, cancellation circuit 10 recovers quickly from sleep mode.

In another embodiment, feedback amplifier 28 may be configured as a low pass filter using a single IC pin for capacitor 34 with its opposite terminal coupled to ground potential.

Hence, what has been provided is a novel offset cancellation circuit for correcting DC offset appearing at the input of a comparator circuit.

We claim:
1. An offset cancellation circuit, comprising:
    a differentiator circuit having an input coupled for receiving an input signal with a DC offset and having an output for providing a differentiated signal with a DC offset;
    a summing junction having first and second inputs and an output, said first input receiving said differentiated signal with said DC offset, said output providing an offset corrected signal; and
    a first amplifier circuit having an input coupled to said output of said summing junction and having an output coupled to said second input of said summing junction for providing an offset correction signal to remove said DC offset from said differentiated signal.
2. The offset cancellation circuit of claim 1 further including a second amplifier circuit coupled between said output of said summing junction and said input of said first amplifier.
3. The offset cancellation circuit of claim 2 wherein said input signal, said differentiated signal, said offset correction signal and said offset corrected signal are each differential signals having first and second components.

4. The offset cancellation circuit of claim 3 wherein said summing junction includes:
    a first node coupled for receiving said first component of said differentiated signal; and
    a second node coupled for receiving said second component of said differentiated signal.
5. The offset cancellation circuit of claim 4 wherein said first amplifier circuit includes:
    current supply means having a plurality of outputs for providing a plurality of currents each having a predetermined value in response to a first bias potential;
    a current mirror circuit having an input coupled to a first one of said plurality of outputs of said current supply means and having an output;
    a first transistor having a collector, a base and an emitter, said base being coupled for receiving said first component of said offset corrected signal from said second amplifier;
    a second transistor having a collector, a base and an emitter, said base being coupled for receiving said second component of said offset corrected signal from said second amplifier, said collectors of said first and second transistors being coupled to said output of said first amplifier;
    first and second resistors coupled between said output of said current mirror circuit and said emitters of said first and second transistors respectively;
    a third transistor having a collector, a base and an emitter, said collector being coupled to said collector of said first transistor;
    a fourth transistor having a collector, a base and an emitter, said collector being coupled to said collector of said second transistor, said bases of said third and fourth transistors being coupled for receiving a second bias potential;
    third and fourth resistors coupled between a first power supply conductor and said emitters of said third and fourth transistors respectively; and
    a capacitor coupled between said collectors of said first and second transistors.
6. The offset cancellation circuit of claim 5 wherein said first amplifier circuit further includes:
    a fifth transistor having a collector, a base and an emitter, said base being coupled to said collector of said first transistor, said collector being coupled to a second power supply conductor, said emitter being coupled to a second one of said plurality of outputs of said current supply means;
    a sixth transistor having a collector, a base and an emitter, said base being coupled to said collector of said second transistor, said collector being coupled to said second power supply conductor, said emitter being coupled to a third one of said plurality of outputs of said current supply means;
    a seventh transistor having a collector, a base and an emitter, said collector being coupled to said first node for conducting said first component of said offset correction signal, said base being coupled to said emitter of said sixth transistor; and
    an eighth transistor having a collector, a base and an emitter, said collector being coupled to said second node for conducting said second component of said offset correction signal, said base being coupled to said emitter of said fifth transistor, said emitters of said seventh and eighth transistors being coupled together to a fourth one of said plurality of outputs of said current supply means for providing said second bias potential.

7. The offset cancellation circuit of claim 6 wherein said second amplifier circuit includes:
   a ninth transistor having a collector, a base and an emitter, said collector being coupled to said second power supply conductor, said base being coupled to said first node, said emitter being coupled to said base of said first transistor;
   a tenth transistor having a collector, a base and an emitter, said collector being coupled to said second power supply conductor, said base being coupled to said second node, said emitter being coupled to said base of said second transistor;
   an eleventh transistor having a collector, a base and an emitter, said collector being coupled to said emitter of said ninth transistor, said base being coupled for receiving said first bias potential;
   a twelfth transistor having a collector, a base and an emitter, said collector being coupled to said emitter of said tenth transistor, said base being coupled for receiving said first bias potential; and
   fifth and sixth resistors coupled between said first power supply conductor and said emitters of said eleventh and twelfth transistors respectively.

8. A method of canceling a DC offset in an input signal, comprising the steps of:
   differentiating the input signal for providing a differentiated signal with a DC offset;
   inverting an offset correction signal for providing an inverted offset correction signal;
   summing said inverted offset correction signal with said differentiated signal with said DC offset for removing said DC offset and providing an offset corrected signal; and
   amplifying said offset corrected signal for providing said offset correction signal.

9. In an integrated circuit a timing qualification circuit, comprising:
   a differentiator circuit having an input coupled for receiving an input signal and having an output for providing a differentiated signal with a DC offset;
   a summing junction having first and second inputs and an output, said first input being coupled for receiving said differentiated signal having said DC offset, said output providing an offset corrected signal;
   a comparator circuit having an input and an output, said input being coupled to said output of said summing junction for receiving said offset corrected signal, said output changing state at each zero crossing of said offset corrected signal corresponding to a peak of said input signal;
   a first amplifier circuit having an input coupled to said input of said comparator and having an output coupled to said second input of said summing junction for providing an offset correction signal to remove said DC offset from said differentiated signal; and
   a zero-crossing detector having an input coupled to said output of said comparator circuit and having an output for providing a clock pulse at said change of state of said output of said comparator corresponding to said peak of the input signal.

10. The timing qualification circuit of claim 9 further including a second amplifier circuit coupled between said output of said summing junction and said input of said comparator.

11. The timing qualification circuit of claim 10 wherein said input signal, said offset correction signal and said offset corrected signal are each differential signals having first and second components.

12. The timing qualification circuit of claim 11 wherein said summing junction includes:
    a first node coupled for receiving said first component of said differential input signal; and
    a second node coupled for receiving said second component of said differential input signal.

13. The timing qualification circuit of claim 12 wherein said first amplifier circuit includes:
    current supply means having a plurality of outputs for providing a plurality of currents each having a predetermined value in response to a first bias potential;
    a current mirror circuit having an input coupled to a first one of said plurality of outputs of said current supply means and having an output;
    a first transistor having a collector, a base and an emitter, said base being coupled for receiving said first component of said offset corrected signal from said second amplifier;
    a second transistor having a collector, a base and an emitter, said base being coupled for receiving said second component of said offset corrected signal from said second amplifier;
    first and second resistors coupled between said output of said current mirror circuit and said emitters of said first and second transistors respectively;
    a third transistor having a collector, a base and an emitter, said collector being coupled to said collector of said first transistor;
    a fourth transistor having a collector, a base and an emitter, said collector being coupled to said collector of said second transistor, said bases of said third and fourth transistors being coupled for receiving a second bias potential;
    third and fourth resistors coupled between a first power supply conductor and said emitters of said third and fourth transistors respectively; and
    a capacitor coupled between said collectors of said first and second transistors.

14. The timing qualification circuit of claim 13 wherein said first amplifier circuit further includes:
    a fifth transistor having a collector, a base and an emitter, said base being coupled to said collector of said first transistor, said collector being coupled to a second power supply conductor, said emitter being coupled to a second one of said plurality of outputs of said current supply means;
    a sixth transistor having a collector, a base and an emitter, said base being coupled to said collector of said second transistor, said collector being coupled to said second power supply conductor, said emitter being coupled to a third one of said plurality of outputs of said current supply means;
    a seventh transistor having a collector, a base and an emitter, said collector being coupled to said first node for conducting said first component of said offset correction signal, said base being coupled to said emitter of said sixth transistor; and
    an eighth transistor having a collector, a base and an emitter, said collector being coupled to said second node for conducting said second component of said offset correction signal, said base being coupled to said emitter of said fifth transistor, said emitters of said seventh and eighth transistors being coupled together to a fourth one of said plurality of outputs of said current supply means for providing said second bias potential.

15. The timing qualification circuit of claim 14 wherein said second amplifier circuit includes:
   a ninth transistor having a collector, a base and an emitter, said collector being coupled to said second power supply conductor, said base being coupled to said first node, said emitter being coupled to said base of said first transistor;
   a tenth transistor having a collector, a base and an emitter, said collector being coupled to said second power supply conductor, said base being coupled to said second node, said emitter being coupled to said base of said second transistor;
   an eleventh transistor having a collector, a base and an emitter, said collector being coupled to said emitter of said ninth transistor, said base being coupled for receiving said first bias potential;
   a twelfth transistor having a collector, a base and an emitter, said collector being coupled to said emitter of said tenth transistor, said base being coupled for receiving said first bias potential; and
   fifth and sixth resistors coupled between said first power supply conductor and said emitters of said eleventh and twelfth transistors respectively.

* * * * *